(12) United States Patent
Ho et al.

(10) Patent No.: US 10,866,608 B2
(45) Date of Patent: Dec. 15, 2020

(54) APPARATUS AND METHOD OF VOLTAGE REGULATION CONTROL FOR INTEGRATED CIRCUIT

(71) Applicant: INTEL CORPORATION, Santa Clara, CA (US)

(72) Inventors: Eng Ling Ho, Seberang Jaya (MY); Ping-Chen Liu, Fremont, CA (US); Chiew Siang Wong, Bayan Lepas (MY); Siaw Chen Lee, Simpang Pertang (MY); Shen Shen Lee, Bayan Lepas (MY)

(73) Assignee: Intel Corporation, Santa Clara, CA (US)

( * ) Notice: Subject to any disclaimer, the term of this patent is extended or adjusted under 35 U.S.C. 154(b) by 820 days.

(21) Appl. No.: 15/365,675

(22) Filed: Nov. 30, 2016

(65) Prior Publication Data

US 2018/0150095 A1     May 31, 2018

(51) Int. Cl.
| | |
|---|---|
| G05F 1/66 | (2006.01) |
| G06F 1/28 | (2006.01) |
| G06F 1/3296 | (2019.01) |
| G06F 1/3234 | (2019.01) |
| G06F 30/34 | (2020.01) |
| G05B 15/02 | (2006.01) |

(52) U.S. Cl.
CPC ............... G05F 1/66 (2013.01); G05B 15/02 (2013.01); G06F 1/28 (2013.01); G06F 1/3243 (2013.01); G06F 1/3296 (2013.01); G06F 30/34 (2020.01); Y02D 10/00 (2018.01)

(58) Field of Classification Search
CPC ... G05F 1/66; G06F 30/34; G06F 1/28; G06F 1/3296; G06F 1/3243; G05B 15/02; G05B 19/04; Y02D 10/00
See application file for complete search history.

(56) References Cited

U.S. PATENT DOCUMENTS

| | | | |
|---|---|---|---|
| 5,467,010 | A | 11/1995 | Quarmby et al. |
| 7,023,672 | B2 | 4/2006 | Goodfellow et al. |
| 7,372,382 | B2 | 5/2008 | Hazucha et al. |
| 7,830,688 | B1 | 11/2010 | Schultz et al. |

(Continued)

OTHER PUBLICATIONS

Hutton (Stratix® 10: 14nm FPGA Delivering 1GHz). (Year: 2015).*

(Continued)

*Primary Examiner* — Jarret J Stark (57) ABSTRACT

One embodiment relates to a method of controlling supply voltage regulation within an integrated circuit. An external interrupt is sent from an external interaction processing layer to a processor in the integrated circuit. Off-die instructions are generated by the external interaction processing layer and sent to the processor. The off-die instructions are executed by the processor to test and adjust supply voltage regulation within the integrated circuit on a sector-by-sector basis. Another embodiment relates to a method of controlling a supply voltage regulator for a sector of an integrated circuit. Commands are sent by a processor and translated by a sector manager to bits. The bits are loaded into registers so as to set the regulator control circuit to the testing mode send a supply voltage to an analog-to-digital converter. Other embodiments and features are also disclosed.

18 Claims, 6 Drawing Sheets

(56) References Cited

U.S. PATENT DOCUMENTS

| | | | |
|---|---|---|---|
| 8,898,029 B1* | 11/2014 | Wong | G06F 1/26 |
| | | | 702/118 |
| 9,256,232 B2 | 2/2016 | Bryson et al. | |
| 9,377,803 B2 | 6/2016 | Watanabe et al. | |
| 9,509,214 B2 | 11/2016 | Ali et al. | |
| 9,582,622 B1* | 2/2017 | Balasubramanian | |
| | | | G06F 30/367 |
| 2003/0178643 A1 | 9/2003 | Ozawa et al. | |
| 2005/0001600 A1 | 1/2005 | Morales | |
| 2010/0329063 A1 | 12/2010 | Cho et al. | |
| 2012/0274297 A1 | 11/2012 | Brown et al. | |
| 2013/0271099 A1 | 10/2013 | Li | |
| 2014/0380070 A1 | 12/2014 | Hua | |
| 2015/0103602 A1* | 4/2015 | Cunningham | G11C 5/145 |
| | | | 365/185.23 |
| 2017/0288648 A1* | 10/2017 | Tang | G05F 1/46 |
| 2018/0076708 A1* | 3/2018 | Bulzacchelli | G05F 1/56 |
| 2018/0115238 A1* | 4/2018 | Bulzacchelli | G05F 1/00 |
| 2018/0143777 A1* | 5/2018 | Dasu | G06F 3/061 |

OTHER PUBLICATIONS

Ting Lu, et al "Stratix 10 Secure Device Manager Provides Best-in-Class FPGA and SoC Security", Jun. 2015, pp. 1-11, White Paper—Altera Corporation.

Extended European Search Report for Patent Application No. 17197873.7, dated Apr. 13, 2018, 10 pages.

* cited by examiner

APPARATUS AND METHOD OF VOLTAGE REGULATION CONTROL FOR INTEGRATED CIRCUIT

BACKGROUND

Technical Field

The present disclosure relates to voltage regulation in integrated circuits.

Description of the Background Art

Field programmable gate arrays (FPGAs) and other programmable logic devices (PLDs) typically receive a power supply voltage from an external voltage regulator. The voltage regulator provides a fixed regulated voltage that is based on a target value. The power supply voltage is distributed to circuits inside the FPGA (or PLD) device.

SUMMARY

One embodiment relates to a method of controlling supply voltage regulation within an integrated circuit. An external interrupt is sent from an external interaction processing layer to a processor in the integrated circuit. Off-die instructions are generated by the external interaction processing layer and sent to the processor. The off-die instructions are executed by the processor to test and adjust supply voltage regulation within the integrated circuit on a sector-by-sector basis.

Another embodiment relates to a method of controlling a supply voltage regulator for a sector of an integrated circuit. Commands are sent by a processor and translated by a sector manager to bits. The bits are loaded into registers so as to set the regulator control circuit to the testing mode send a supply voltage to an analog-to-digital converter.

Another embodiment relates to an integrated circuit that includes at least: a sector manager that manages a sector of the integrated circuit and receives a command from a processor; a test control register that receives a first set of bits from the sector manager; a supply voltage regulator for the sector; and a multiplexor. When the first set of bits in the test control register indicates a testing mode, control signals are output that cause the multiplexor to select an analog supply voltage output by the voltage regulator.

Another embodiment relates to an integrated circuit that includes at least: a processor; a plurality of sector managers, each sector manager managing a corresponding sector of the integrated circuit and receiving commands from the processor; a processor network connecting the processor to the plurality of sector managers; and a plurality of regulator control circuits, each regulator control sector controlling a supply voltage regulator for the corresponding sector of the integrated circuit. Each regulator control circuit includes a sector manager which asserts an analog test control signal that enables a first set of bits to be loaded into a test control register.

Other embodiments and features are also disclosed.

DETAILED DESCRIPTION

To reduce component cost and complexity of on-board power supply circuitry, a voltage regulator may be provided internally within an FPGA or PLD device, instead of externally on the circuit board. However, existing voltage regulator approaches within FPGA and PLD devices generally lack the capability to dynamically monitor and adjust the regulated voltage.

For example, a single power supply device may use one external board power supply to feed several on-die regulators, where each regulator generates a fixed nominal voltage for a respective power rail. This fixed voltage lacks flexibility to dynamically scale for power for purposes of performance management (for example, for different performance modes, such as sleep mode, low power mode, or high performance mode).

In another example, a smart voltage identifier (voltage ID or VID) method uses fixed fuse settings to derive a voltage offset to be applied to a fixed nominal voltage. The voltage offset may be used to save power by reducing the voltage for a fast part which has performance headroom. Alternatively, the voltage offset may be used to increase performance by increasing the voltage for a slow part which has power headroom. This fixed voltage offset is an "open loop" approach that lacks the flexibility to dynamically scale for better accuracy.

The present disclosure provides an apparatus and method to dynamically monitor and adjust an on-die voltage regulator within an integrated circuit chip (such as an FPGA or PLD) to optimize power management. The apparatus and method provide a closed loop voltage regulator monitoring system with a sector architecture to monitor and process voltage readings and, accordingly, adjust the voltage regulator's output voltage to an on-die power grid. The system includes an internal/external control loop and a networked microprocessor-based control interface and transport system.

The apparatus and method disclosed herein may be utilized advantageously to provide various useful device features. For example, the apparatus and method may be used to monitor a voltage state to detect environmental tampering for purposes of security. As a second example, the apparatus and method may be used in a closed loop configuration to continuously monitor and calibrate (adjust) the output voltage of the voltage regulator to optimize performance in response to PVT changes. As a third example, the apparatus and method may be used for intelligent power management using software control to put the device into various power states, including power down, standby, low power and high performance operation. As a fourth example, the apparatus and method supports both internal closed-loop operation and off-die external interaction loop operation.

Figure 1:
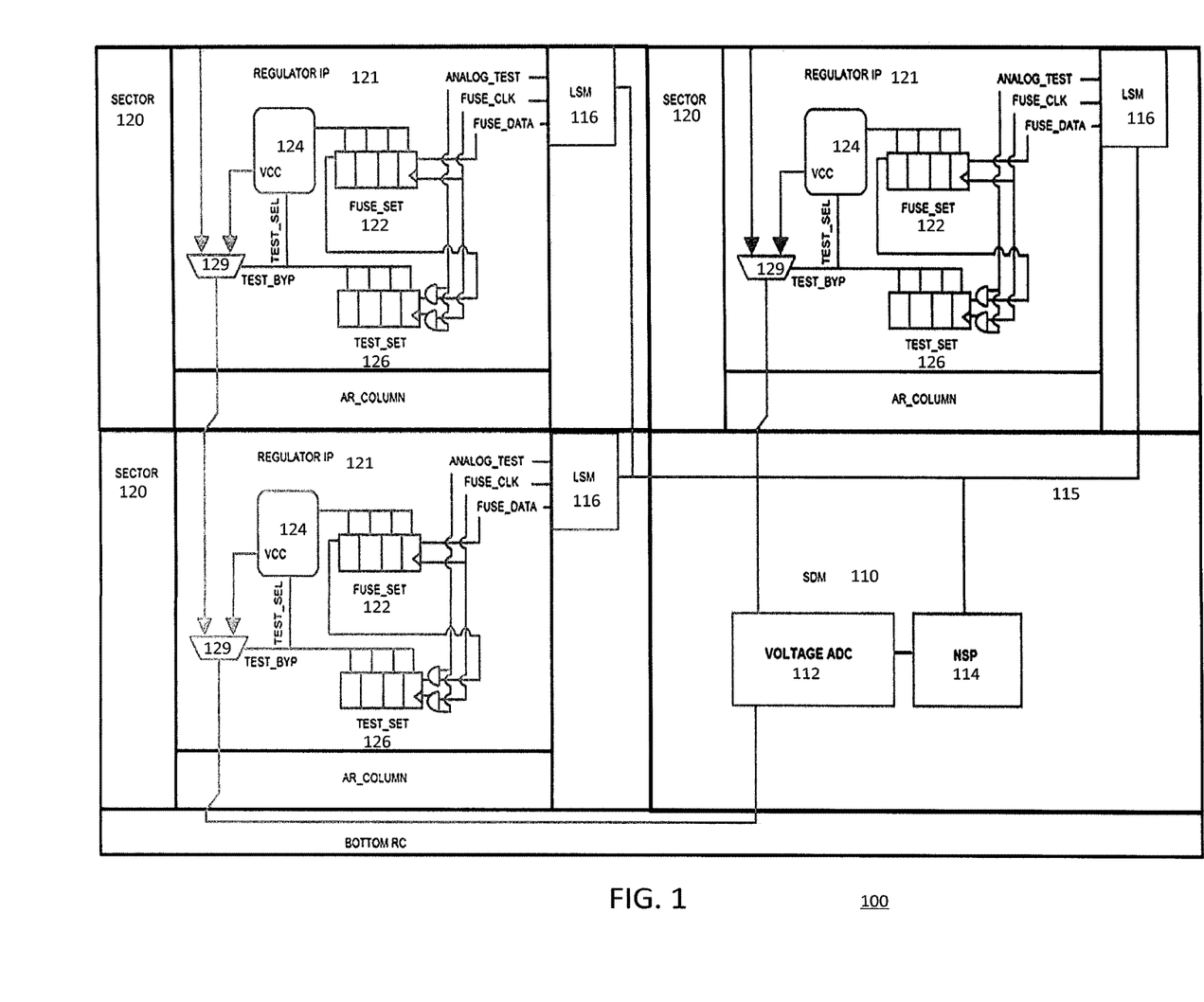
FIG. 1 depicts an exemplary circuit apparatus for voltage regulation control in accordance with an embodiment of the invention.

FIG. 1 depicts an exemplary on-die circuit apparatus 100 for voltage regulation control in accordance with an embodiment of the invention. The circuit apparatus 100 controls internally-regulated power supplies (VCC) to on-die circuits.

As depicted, the circuit apparatus 100 may include a secure device manager (SDM) 110. The SDM 110 may include an analog-to-digital voltage converter (voltage ADC) 112 and a central microprocessor (network signal processor or NSP) 114.

The NSP 114 may be configured to provide commands to multiple local sector managers (LSMs) 116 via a full-chip processor network bus 115. The voltage ADC 112 may selectively receive analog supply voltage (VCC) signals from one or more sectors of the integrated circuit die and convert them to digital form for further processing by the NSP 114.

Each LSM 116 comprises a processor that is advantageously configured to utilize regulator control (regulator IP) circuit 121 to control the voltage regulator 124 for a corresponding sector 120 of the on-die circuitry. The regulator control circuit 121 may include a voltage trimming (FUSE_SET) register 122 and a test control (TEST_SET) register 126. As shown, these two registers may be arranged in a serial chain. The regulator control circuit 121 may also include an analog multiplexor 129.

Each LSM 116 may receive commands from the NSP 114 and translate those commands to configuration bits that may be loaded, serially, to the FUSE_SET and TEST_SET registers. In an exemplary implementation, the loading of the configuration bits to the FUSE_SET and TEST_SET registers may be controlled by ANALOG_TEST and FUSE_DATA control signals, and the FUSE_CLK clock signal provides the timing signal for loading the FUSE_SET and TEST_SET registers.

The analog testing may be disabled during a normal (non-testing) operating mode by resetting the ANALOG_TEST signal to logical 0. This deactivates the testing mode by causing only logical 0 bits to be loaded into the TEST_SET register (due to one input of the AND logic gate at the data input of the TEST_SET register being logical 0) such that both TEST_SEL and TEST_BYPASS control signals are disabled.

On the other hand, the analog testing may be enabled during a testing mode by setting the ANALOG_TEST signal to logical 1. This activates the testing mode by causing a first segment of bits from the series of bits provided by the FUSE_DATA signal to be loaded to the TEST_SET register (due to one input of the AND logic gate at the data input of the TEST_SET register being logical 1 and the other input being the FUSE_DATA signal as output serially from the FUSE_SET register).

The bit segment that is loaded into the FUSE_SET register may provide voltage trimming bits is fed to input pins of the voltage regulator 124. These voltage trimming bits controls the variable trimming (variable adjustment) of the regulated supply voltage (VCC) that is output by the voltage regulator 124 for the local sector 120.

The bit segment that is loaded into the TEST_SET register provides control bits to the voltage regulator 124 and the analog multiplexor 129. These control bits may include a test selection (TEST_SEL) bit that is provided via a selection line to the local voltage regulator 124 and a multiplexer control (TEST_BYPASS) bit that is provided via a control line to the analog multiplexor 129.

The analog multiplexor 129 may be controlled by the TEST_BYPASS bit to controllably interconnect the regulated supply voltage (VCC) for the local sector 120 to an analog signal bus 130. In one implementation, each column (AR_COLUMN) may have a separate analog signal bus 130 that may be used to selectively route the regulated VCC output of one of the sectors in the column to the voltage ADC 112 of the SDM 110.

The analog signal bus 130 for the column in which the voltage ADC 112 is located may provide the analog signal for that column directly to the voltage ADC 112. A bottom routing channel (bottom RC) may be used to route analog signals from other columns to the voltage ADC 112. Thus, the analog voltage output (VCC) of any voltage regulator 124 may be routed to be an analog input to the voltage ADC 112. In an exemplary implementation, the analog MUXes 129 are controlled so that the voltage ADC 112 receives the analog voltage output (VCC) from a single voltage regulator 124 at one time.

The voltage ADC 112 converts the analog voltage state a digital number, and the digital reading may be acquired by the central microprocessor (NSP) 114. The central microprocessor 114 may be loaded with a set of software operating code to process the digital readings from the voltage ADC 112.

Figure 2:
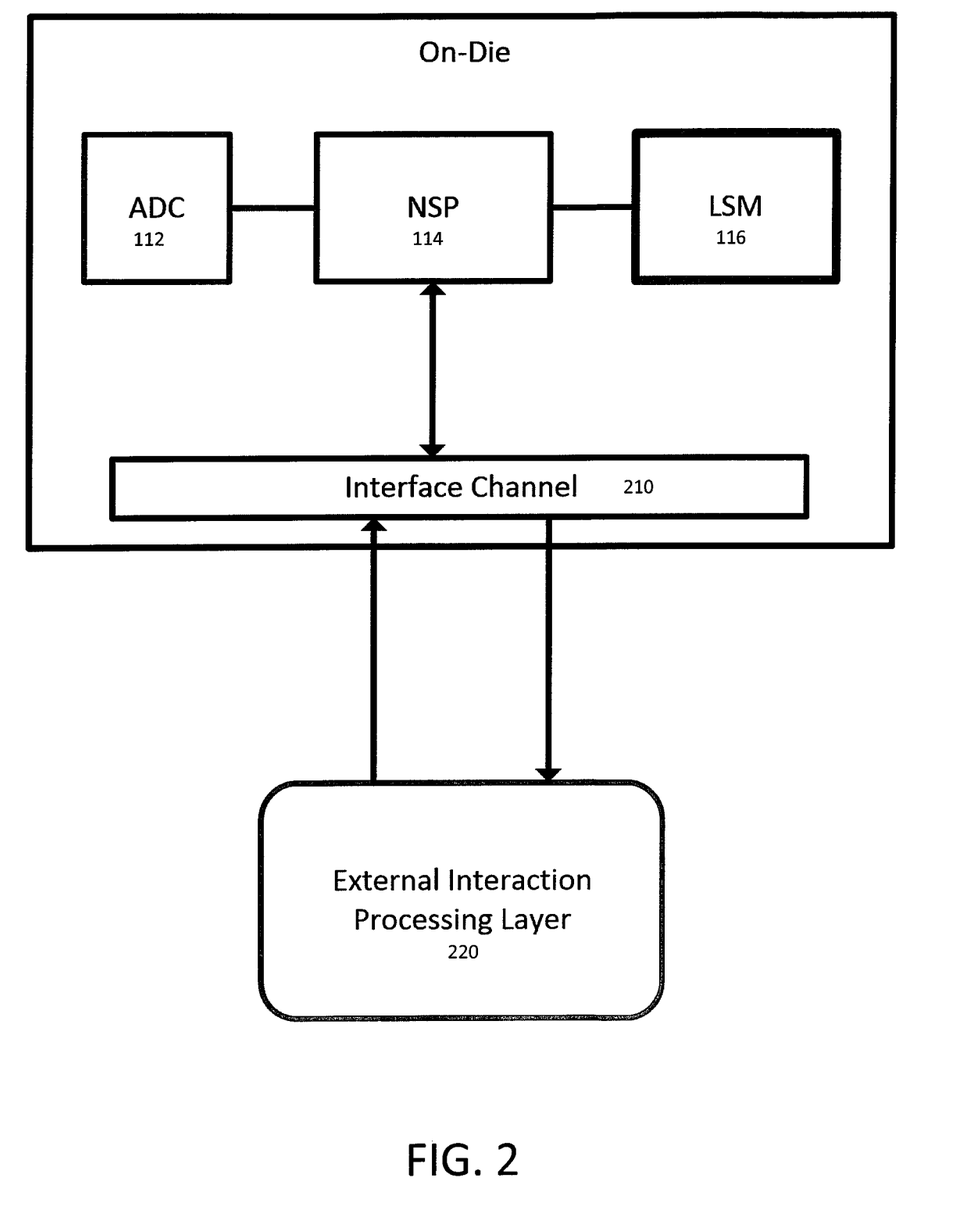
FIG. 2 depicts an exemplary structure for an external control loop that interacts with the circuit apparatus for voltage regulation control in accordance with an embodiment of the invention.

FIG. 2 depicts an exemplary structure for an external control loop that interacts with the circuit apparatus 100 for voltage regulation control in accordance with an embodiment of the invention. The external control loop may be formed using an external interaction processing layer 220.

The external interaction processing layer 220 may be activated by using an external interface channel 210 built to the central processor (NSP) 114. User instruction sets may be synthesized off-die by the external interaction processing layer 220 and fed to the NSP 114 via the interface channel 210.

Figure 3:
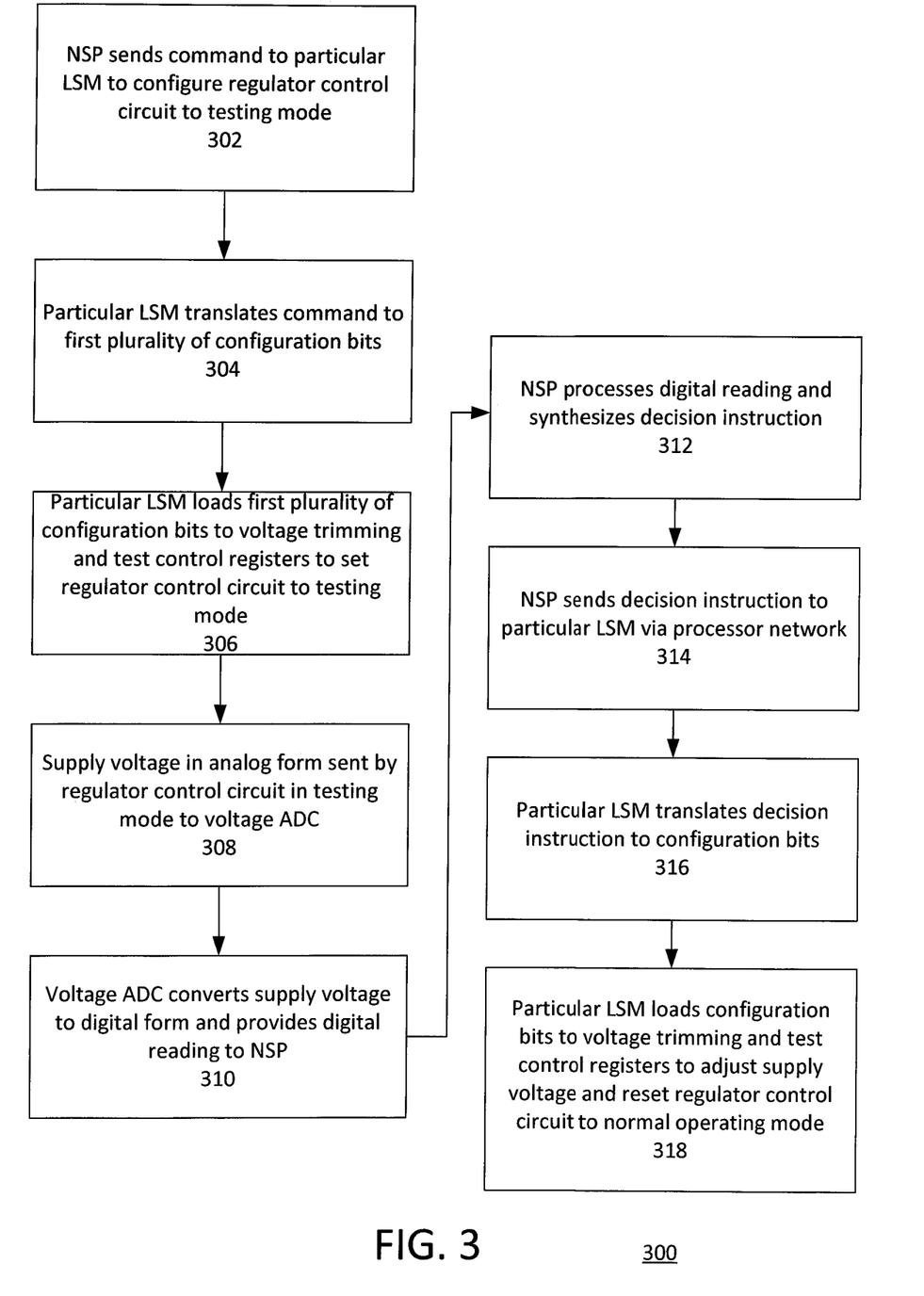
FIG. 3 is a flow chart of an exemplary procedure for controlling supply voltage regulation for a sector of an integrated circuit chip in accordance with an embodiment of the invention.

FIG. 3 is a flow chart of an exemplary procedure 300 for controlling supply voltage regulation for a sector of an integrated circuit chip in accordance with an embodiment of the invention. The exemplary procedure 300 may be performed, for example, using the on-die circuit apparatus 100 described above in relation to FIG. 1.

Per step 302, the NSP may send a command to a particular (selected) local sector manager (LSM) to configure the regulator control (regulator IP) circuit for the sector to a testing mode. Per step 304, the particular LSM translates the command to a first plurality of configuration bits.

Per step 306, the first plurality of configuration bits are loaded by the particular LSM to the voltage trimming (FUSE_SET) register and test control (TEST_SET) register. In this case, the configuration bits in the test control register set the regulator control circuit to a testing mode, while the configuration bits in the voltage trimming register maintains (does not yet adjust) the voltage level of the supply voltage.

Per step 308, the supply voltage in analog form is sent by the regulator control circuit in the testing mode to the voltage ADC. Per step 310, the voltage ADC converts supply voltage to digital form and provides the resultant digital reading to the central processor (NSP).

Per step 312, the NSP processes the digital reading and synthesizes (generates) a decision instruction. Per step 314, the NSP sends the decision instruction via the processor network to the particular LSM that is being adjusted or calibrated.

Per step 316, the particular LSM translates the decision instruction to a second plurality of configuration bits. Per step 318, the particular LSM loads the second plurality of configuration bits to the voltage trimming and test control registers. This adjusts the supply voltage (per the configuration bits in the voltage trimming register) and resets the regulator control circuit for the associated sector to normal operating mode (per the configuration bits in the test control register).

Figure 4:
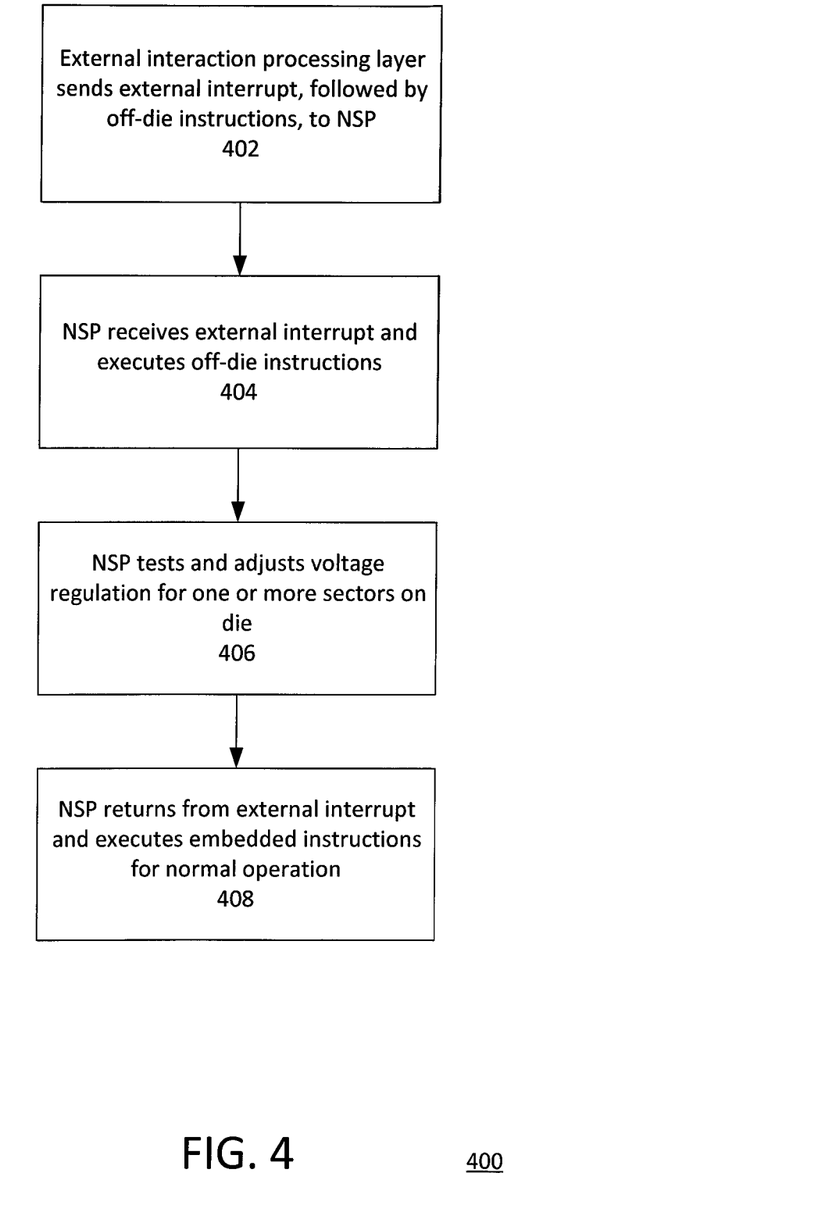
FIG. 4 is a flow chart of an exemplary procedure for using an external interaction control loop for controlling voltage regulation on a sector-by-sector basis within an integrated circuit chip in accordance with an embodiment of the invention.

FIG. 4 is a flow chart of an exemplary procedure 400 for using an external interaction control loop for controlling voltage regulation on a sector-by-sector basis within an integrated circuit chip in accordance with an embodiment of the invention. The exemplary procedure 400 may be performed, for example, using the external control loop described above in relation to FIG. 2.

Per step 402, an external interaction processing layer sends an external interrupt, followed by off-die instructions, via the interface channel to the central processor (NSP). The external interaction processing layer may be implemented using software executing on an external computing system.

Per step 404, the NSP receives the external interrupt and executes the off-die instructions sent by the external interaction processing layer. The off-die instructions may include instructions for the NSP to generate commands to send via the processor network to the LSMs and instructions for the NSP to process digital data received from the voltage ADC.

Per step 406, under control of the off-die instructions, the NSP may test and adjust the supply voltage regulation of one or more sectors on the die. This step may be performed, for example, using the exemplary procedure described above in relation to FIG. 3 for each voltage regulator that needs to be calibrated (tested and adjusted). In order to generate the off-die instructions to adjust the supply voltage regulators, the external interaction processing layer may acquire and process digital readings output by the voltage ADC and made available to the external interaction processing layer by the interface channel.

Finally, per step 408, the NSP may return from the external interrupt. Thereafter, the embedded instructions for normal operation may be executed.

Figure 5:
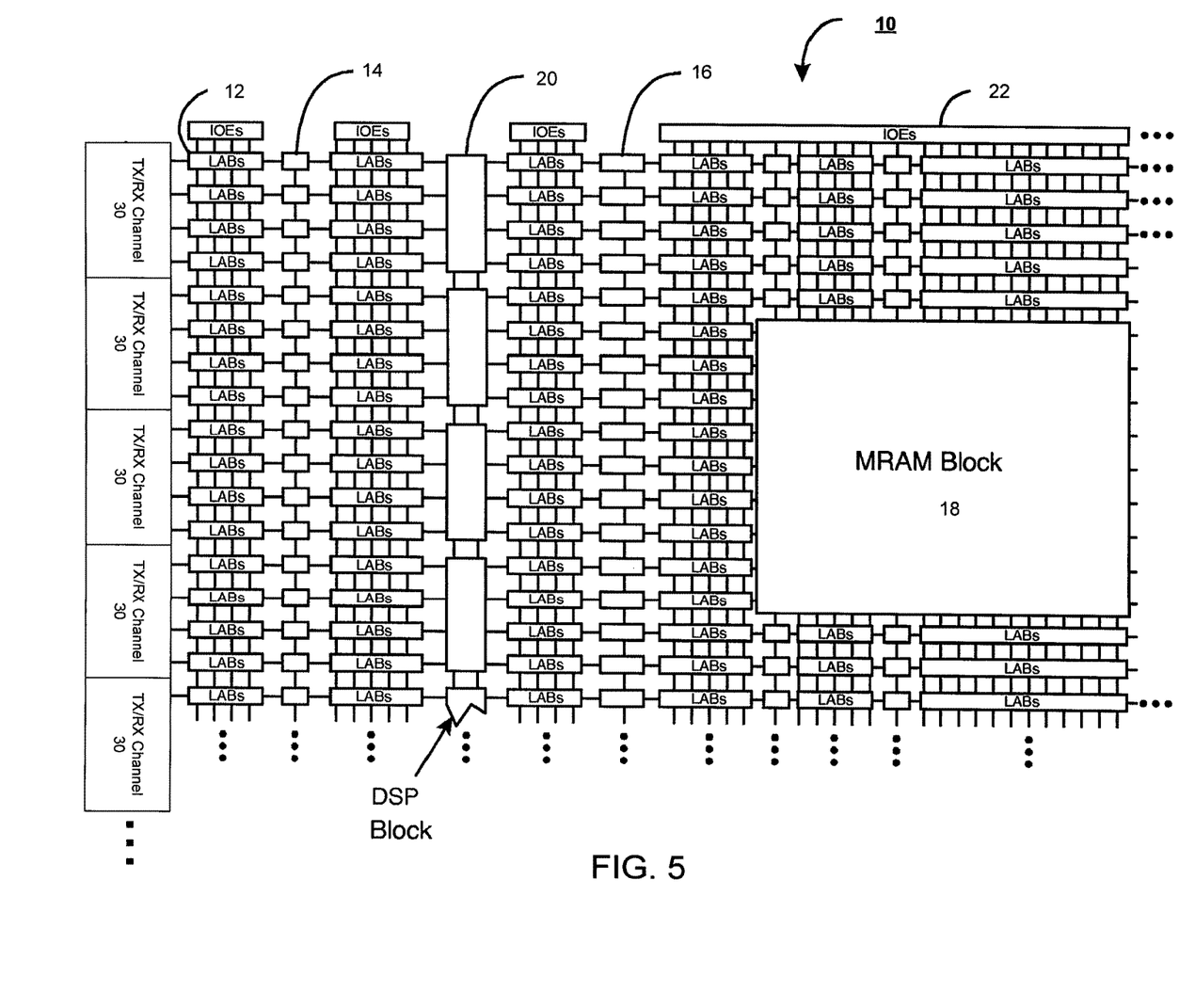
FIG. 5 is a simplified partial block diagram of a field programmable gate array (FPGA) that may be arranged to include aspects of the present invention.

FIG. 5 is a simplified partial block diagram of a field programmable gate array (FPGA) 10 that may be arranged to include aspects of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), digital signal processors (DSPs) and application specific integrated circuits (ASICs).

FPGA 10 includes within its "core" a two-dimensional array of programmable logic array blocks (or LABs) 12 that are interconnected by a network of column and row interconnect conductors of varying length and speed. LABs 12 include multiple (e.g., ten) logic elements (or LEs).

An LE is a programmable logic block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 10 may also include a distributed memory structure including random access memory (RAM) blocks of varying sizes provided throughout the array. The RAM blocks include, for example, blocks 14, blocks 16, and block 18. These memory blocks can also include shift registers and FIFO buffers.

FPGA 10 may further include digital signal processing (DSP) blocks 20 that can implement, for example, multipliers with add or subtract features. Input/output elements (IOEs) 22 located, in this example, around the periphery of the chip support numerous single-ended and differential input/output standards. Each IOE 22 is coupled to an external terminal (i.e., a pin) of FPGA 10. A transceiver (TX/RX) channel array may be arranged as shown, for example, with each TX/RX channel circuit 30 being coupled to several LABs.

It is to be understood that FPGA 10 is described herein for illustrative purposes only and that the present invention can be implemented in many different types of PLDs, FPGAs, and ASICs.

Figure 6:
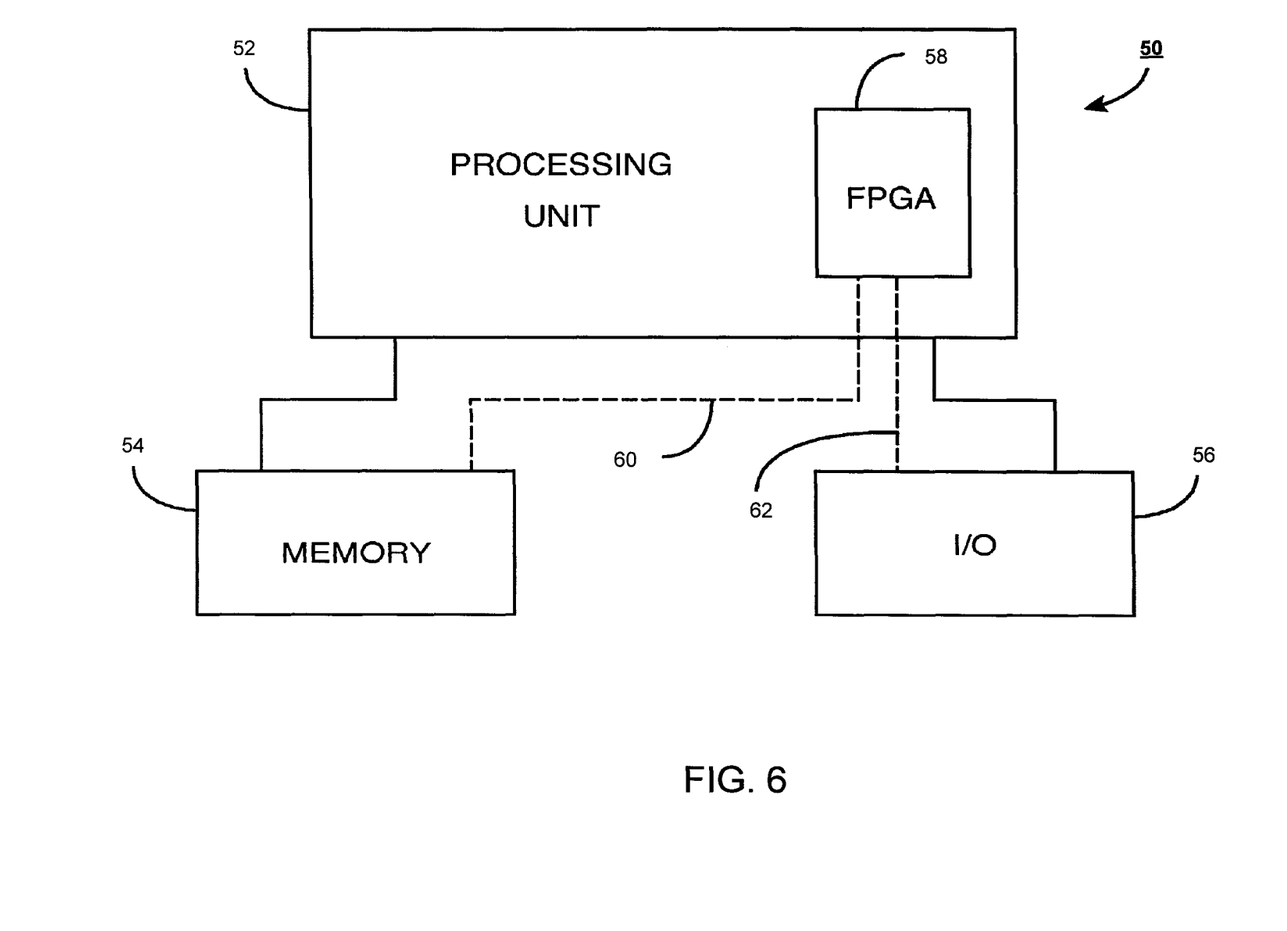
FIG. 6 is a block diagram of an exemplary digital system that can employ techniques of the present invention.

FIG. 6 shows a block diagram of an exemplary digital system 50 that can embody techniques of the present invention. System 50 may be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 50 may be provided on a single board, on multiple boards, or within multiple enclosures.

System 50 includes a processing unit 52, a memory unit 54, and an input/output (I/O) unit 56 interconnected together by one or more buses. According to this exemplary embodiment, FPGA 58 is embedded in processing unit 52. FPGA 58 can serve many different purposes within the system 50. FPGA 58 can, for example, be a logical building block of processing unit 52, supporting its internal and external operations. FPGA 58 is programmed to implement the logical functions necessary to carry on its particular role in system operation. FPGA 58 can be specially coupled to memory 54 through connection 60 and to I/O unit 56 through connection 62.

Processing unit 52 may direct data to an appropriate system component for processing or storage, execute a program stored in memory 54, receive and transmit data via I/O unit 56, or other similar function. Processing unit 52 may be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 58 may control the logical operations of the system. As another example, FPGA 58 acts as a reconfigurable processor that may be reprogrammed as needed to handle a particular computing task. Alternately, FPGA 58 may itself include an embedded microprocessor. Memory unit 54 may be a random access memory (RAM), read only memory (ROM), fixed or flexible disk media, flash memory, tape, or any other storage means, or any combination of these storage means.

CONCLUSION

The present disclosure provides hardware changes to an integrated circuit chip (such as a PLD or FPGA) to enable continuous voltage monitoring and dynamic voltage adjustment to scale the regulated voltage output for optimum power and performance management. Provided are a closed loop voltage regulator monitoring system, external override system, and networked microprocessor based control/interface/transport system. The ingenuity of the disclosure described here is A software-oriented procedure system based on a sector architecture is used advantageously to monitor and process voltage readings, as well as adjust accordingly a voltage regulator's output to an on-die power grid. An off-die external control loop is also provided.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc.

In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize. These modifications may be made to the invention in light of the above detailed description.

What is claimed is:

1. An integrated circuit comprising:
   a first sector manager circuit that manages a first sector of the integrated circuit;
   a test control register that receives a first set of bits from the first sector manager circuit;
   a first supply voltage regulator for the first sector;
   a second supply voltage regulator for a second sector of the integrated circuit;
   a first multiplexor in a first regulator control circuit; and
   a second multiplexor in a second regulator control circuit,
   wherein a first output of the test control register is coupled to a first input of the first multiplexor via a control line, wherein a second input of the first multiplexor is coupled to an analog supply voltage output of the first supply voltage regulator, wherein a third input of the first multiplexor is coupled to an output of the second multiplexor, and wherein a first input of the second multiplexor is coupled to an analog supply voltage output of the second supply voltage regulator.

2. The integrated circuit of claim 1, wherein the first sector manager circuit asserts an analog test control signal that enables the first set of bits to be loaded into the test control register.

3. The integrated circuit of claim 1, further comprising:
   a voltage trimming register that receives a second set of bits from the first sector manager circuit,
   wherein the second set of bits in the voltage trimming register controls adjustment of a voltage level of the analog supply voltage output of the first supply voltage regulator.

4. The integrated circuit of claim 3, wherein the first and second sets of bits are loaded serially to the test control register and the voltage trimming register, respectively.

5. The integrated circuit of claim 1, further comprising:
   a processor;
   a second sector manager circuit that manages the second sector of the integrated circuit and that receives commands from the processor; and
   a processor network connecting the processor to the first and second sector manager circuits,
   wherein the first and second regulator control circuits comprise the first and second sector manager circuits for the respective first and second sectors of the integrated circuit.

6. The integrated circuit of claim 1 further comprising:
   a voltage analog-to-digital converter, wherein an output of the first multiplexor is coupled to an input of the voltage analog-to-digital converter.

7. The integrated circuit of claim 1, wherein the first regulator control circuit further comprises a first voltage trimming register, wherein an output of the first voltage trimming register is coupled to an input of the first supply voltage regulator, wherein the second regulator control circuit further comprises a second voltage trimming register, and wherein an output of the second voltage trimming register is coupled to an input of the second supply voltage regulator.

8. The integrated circuit of claim 1, wherein the test control register is coupled via a selection line to the first supply voltage regulator.

9. An integrated circuit comprising:
   a first sector manager circuit that manages a first sector of the integrated circuit;
   a first regulator control circuit comprising a test control register and a first multiplexor, wherein the test control register receives a first set of bits from the first sector manager circuit;
   a first supply voltage regulator for the first sector;
   a second supply voltage regulator for a second sector of the integrated circuit; and
   a second regulator control circuit comprising a second multiplexor, wherein a first input of the first multiplexor is coupled to the test control register via a control line, wherein a second input of the first multiplexor is coupled to a supply voltage output of the first supply voltage regulator, wherein an output of the first multiplexor is coupled to a first input of the second multiplexor, and wherein a second input of the second multiplexor is coupled to a supply voltage output of the second supply voltage regulator.

10. The integrated circuit of claim 9 further comprising:
    a processor circuit that provides commands to the first sector manager circuit.

11. The integrated circuit of claim 10, wherein the processor circuit processes a digital reading of a supply voltage generated by the first supply voltage regulator to generate a decision instruction and provides the decision instruction to the first sector manager circuit.

12. The integrated circuit of claim 11, wherein the first regulator control circuit further comprises:
    a voltage trimming register, and wherein the first sector manager circuit translates the decision instruction to a second set of bits and loads the second set of bits into the voltage trimming register and the test control register.

13. The integrated circuit of claim 12, wherein the voltage trimming register adjusts a voltage level of the supply voltage based on a first plurality of the second set of bits stored in the voltage trimming register.

14. The integrated circuit of claim 13, wherein the test control register resets the first regulator control circuit to a normal operating mode based on a second plurality of the second set of bits in the test control register.

15. The integrated circuit of claim 9 further comprising:
    a voltage analog-to-digital converter, wherein an output of the second multiplexor is coupled to an input of the voltage analog-to-digital converter.

16. The integrated circuit of claim 9, wherein the first regulator control circuit further comprises:
 a voltage trimming register that receives a second set of bits from the first sector manager circuit, and wherein the second set of bits in the voltage trimming register controls adjustment of a voltage level of the supply voltage output of the first supply voltage regulator.

17. The integrated circuit of claim 9, wherein the second regulator control circuit further comprises an additional test control register coupled to a third input of the second multiplexor.

18. The integrated circuit of claim 9 further comprising:
 a processor;
 a second sector manager circuit managing the second sector of the integrated circuit and receiving commands from the processor; and
 a processor network connecting the processor to the first and second sector manager circuits.

* * * * *